United States Patent
Tsai et al.

(10) Patent No.: US 8,823,179 B2
(45) Date of Patent: Sep. 2, 2014

(54) ELECTRONIC DEVICE PACKAGE AND METHOD FOR FABRICATING THE SAME

(76) Inventors: Chia-Lun Tsai, Tainan (TW); Wen-Cheng Chien, Hsinchu (TW); Po-Han Lee, Taipei (TW); Wei-Ming Chen, Hsinchu (TW); Chien-Hung Liu, Xindian (TW); Ying-Nan Wen, Taoyuan (TW)

( * ) Notice: Subject to any disclaimer, the term of this patent is extended or adjusted under 35 U.S.C. 154(b) by 414 days.

(21) Appl. No.: 12/667,383

(22) PCT Filed: Jun. 13, 2008

(86) PCT No.: PCT/CN2008/001145
§ 371 (c)(1),
(2), (4) Date: Dec. 30, 2009

(87) PCT Pub. No.: WO2009/140798
PCT Pub. Date: Nov. 26, 2009

(65) Prior Publication Data
US 2010/0187697 A1    Jul. 29, 2010

Related U.S. Application Data

(60) Provisional application No. 61/128,358, filed on May 21, 2008.

(51) Int. Cl.
*H01L 23/48* (2006.01)
*H01L 27/146* (2006.01)
*H01L 21/768* (2006.01)
*H01L 23/00* (2006.01)

(52) U.S. Cl.
CPC ....... *H01L 23/481* (2013.01); *H01L 2924/3025* (2013.01); *H01L 27/14618* (2013.01); *H01L 27/14683* (2013.01); *H01L 21/76898* (2013.01); *H01L 2924/01079* (2013.01); *H01L 2924/01078* (2013.01); *H01L 2924/01021* (2013.01); *H01L 2924/14* (2013.01); *H01L 24/12* (2013.01)
USPC ........................................................ 257/774

(58) Field of Classification Search
CPC ........... H01L 2924/01078; H01L 2924/01079; H01L 2924/01029; H01L 23/5526; H01L 23/481
USPC .......... 257/774, 773, E23.151, 778, 667, 672, 257/779, 780, 784
See application file for complete search history.

(56) References Cited

U.S. PATENT DOCUMENTS 6,982,487 B2 * 1/2006 Kim et al. ..................... 257/774

(Continued)

FOREIGN PATENT DOCUMENTS

| CN | 1728370 | 2/2006 |
|---|---|---|
| CN | 1770437 | 5/2006 |

(Continued)

OTHER PUBLICATIONS

PCT International Search Report of Counterpart PCT Application No. PCT/CN2008/001145.

*Primary Examiner* — Hoa B Trinh
(74) *Attorney, Agent, or Firm* — Liu & Liu

(57) ABSTRACT

An embodiment of the present invention provides an electronic device package, which includes a chip having a first surface and an opposite second surface and a trench extending into a body of the chip along a direction from the second surface to the first surface, wherein a bottom portion of the trench includes at least two contact holes.

24 Claims, 15 Drawing Sheets

(56) References Cited

U.S. PATENT DOCUMENTS

| | | | |
|---|---|---|---|
| 7,719,118 B2 * | 5/2010 | Adkisson et al. | 257/778 |
| 2007/0182007 A1 | 8/2007 | Jeng et al. | |
| 2012/0028458 A1 * | 2/2012 | Cabral et al. | 438/623 |

FOREIGN PATENT DOCUMENTS

| | | |
|---|---|---|
| CN | 101110378 | 1/2008 |
| JP | 05-343466 | 12/1993 |
| TW | 502379 | 9/2002 |

* cited by examiner

ELECTRONIC DEVICE PACKAGE AND METHOD FOR FABRICATING THE SAME

This Application is a 371 National Stage Entry of Chinese Application No. PCT/CN2008/001145, filed on Jun. 13, 2008, which claims the benefit of U.S. Provisional Application No. 61/128,358, filed on May 21, 2008, the entirety of which are incorporated by reference herein.

FIELD OF THE PRESENT INVENTION

The present invention relates to an electronic device package, and in particular relates to an electronic device package formed by a wafer level chip scale package (WLCSP) process and method for fabricating the same.

BACKGROUND OF THE PRESENT INVENTION

Through-silicon via packaging (TSV package process) techniques have been disclosed to package advanced electronic devices. However, the process of the TSV package process is limited because the process is concerned with high aspect ratio etching in a silicon substrate and film filling process in such a high aspect ratio opening. Particularly, it is more difficult to form a conducting layer extending from such an opening with high aspect ratio.

FIG. 1 shows a top view of a portion of a conventional electronic device package. In FIG. 1, an electronic device package 1 having a plurality of conductive pads 12 disposed therein is provided. In the conventional TSV package process, holes 13b are formed at the positions each corresponding to each of the conductive pads 12. Each hole 13b further surrounds a single contact hole 13a to expose a corresponding conductive pad 12.

However, filling of the material layers is difficult as the aspect ratio (d/w) of the hole 13b may be at least as high as 1.6. Accordingly, a novel electronic device package and method for fabricating the same are desired.

BRIEF SUMMARY OF THE PRESENT INVENTION

According to an illustrative embodiment, an electronic device package is provided. The package comprises a chip having a first surface and an opposite second surface and a trench extending into a body of the chip along a direction from the second surface to the first surface, wherein a bottom portion of the trench includes at least two contact holes.

According to an illustrative embodiment, a method for fabricating an electronic device package is provided. The method comprises providing a wafer comprising a plurality of die regions to carry or form a plurality of chips thereon, wherein each of the chips has a first surface and an opposite second surface, and a plurality of conducting electrodes are on or overlying the first surface of each of the chips, forming a plurality of trenches in each of the chips, the trenches extending along a direction from the second surface to the first surface, wherein a bottom portion of each of the trenches exposes at least two conducting electrodes, conformally forming an insulating layer to cover the second surfaces of the chips and extend to sidewalls and the bottom portions of the trenches, and patterning the insulating layer to form at least two contact holes on the bottom portion of the each of the trenches to expose surfaces of the conducting electrodes.

According to another illustrative embodiment, an electronic device package is provided. The package comprises a chip having a first surface and an opposite second surface and a trench extending into a body of the chip along a direction from the second surface to the first surface, wherein a bottom portion of the trench includes at least two contact holes, an insulating layer conformally covering the second surface of the chip, extending to overlie a sidewall of the trench, and surround each of the contact holes at the bottom portion of the trench, a plurality of conducting electrodes are directly on or overly the first surface of the chip, wherein each of the contact holes at the bottom portion of the trench exposes a contact surface of a corresponding conducting electrode, and wherein each of the conducting electrodes comprises a conductive pad or a redistribution layer, and a plurality of trace layers overlying the insulating layer, wherein each of the trace layers extends from the second surface to the sidewall of the trench and extends overlying the contact surface of a corresponding conducting electrode through the corresponding contact hole.

According to another illustrative embodiment, a method for fabricating an electronic device package is provided. The method comprises providing a wafer comprising a plurality of die regions to carry or form a plurality of chips thereon, wherein each of the chips has a first surface and an opposite second surface, a plurality of conducting electrodes are on or overlying the first surface of each of the chips, and a first insulating layer is between the chips and the conducting electrodes, forming a plurality of trenches in each of the chips, the trenches extending along a direction from the second surface to the first surface, wherein bottom portions of the trenches are separated from the first surfaces of the chips by a predetermined distance, etching the bottom portions of the trenches to form a plurality of contact holes exposing the first insulating layer, wherein at least one of the trenches comprises at least two of the contact holes, etching the first insulating layer in the contact holes to expose the conducting electrodes, conformally forming a second insulating layer to cover the second surfaces of the chips and extend to sidewalls and the bottom portions of the trenches, the second insulating layer further extending from the bottom portions of the trenches to sidewalls of the contact holes, and forming a plurality of trace layers overlying the second insulating layer, wherein each of the trace layers extends from the second surface to the sidewall of the trench and extends overlying a contact surface of the conducting electrode through the corresponding contact hole on the bottom portion of the trench.

According to yet another illustrative embodiment, a method for fabricating an electronic device package is provided. The method comprises providing a wafer comprising a plurality of die regions to carry or form a plurality of chips thereon, wherein there is a scribe line region between ant two adjacent chips, each of the chips has a first surface and an opposite second surface, a plurality of conducting electrodes are on or overlying the first surface of each of the chips, and a first insulating layer is between the chips and the conducting electrodes, forming a trench occupying sides and the scribe line region between the two adjacent chips, wherein the trench extends along a direction from the second surface to the first surface, and bottom portion of the trench is separated from the first surfaces of the two adjacent chips by a predetermined distance, etching the bottom portion of the trench to form a plurality of contact holes exposing the first insulating layer in the two adjacent chips, respectively, etching the first insulating layer in the contact holes to expose the conducting electrodes, conformally forming a second insulating layer to cover the second surfaces of the chips and extend to a sidewall and the bottom portion of the trench, the second insulating layer further extending from the bottom portion of the trench to sidewalls of the contact holes, and forming a plurality of trace layers overlying the second insulating layer, wherein each of the trace layers extends from the second surface to the sidewall and the bottom portion of the trench and extends overlying a contact surface of the conducting electrode through the corresponding contact hole.

According to yet another embodiment, an electronic device package is provided. The package comprises a chip having a first surface and an opposite second surface, wherein a peripheral region located on the second surface concaves downward to form a trench region, and wherein a bottom portion of the trench region is separated from the first surface by a predetermined distance, a plurality of conducting electrodes directly on or overlying the first surface of the chip, and at least two contact holes extending from the bottom portion of the trench region to the corresponding conducting electrodes to expose contact surfaces of the corresponding conducting electrodes.

BRIEF DESCRIPTION OF THE DRAWINGS

The present invention can be more fully understood by reading the subsequent detailed description and examples with references made to the accompanying drawings, wherein.

DETAILED DESCRIPTION OF THE PRESENT INVENTION

Figure 1:
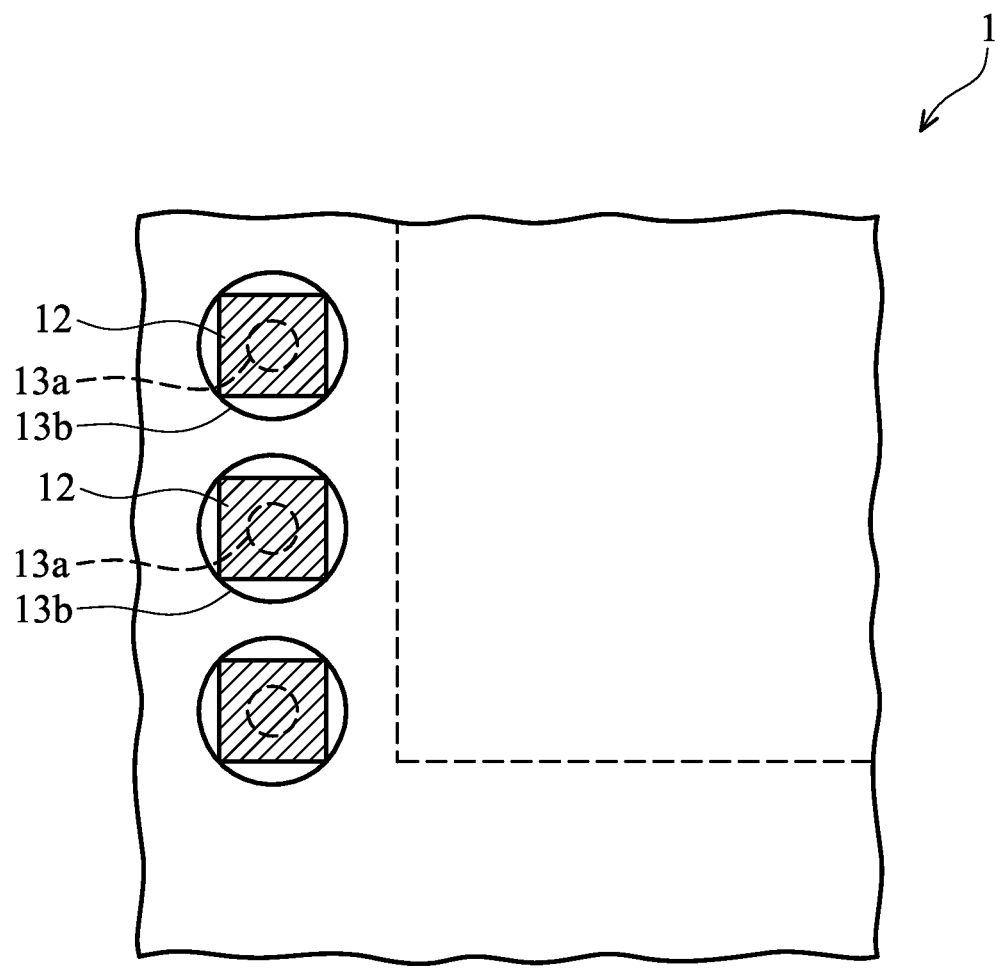
FIG. 1 is a top view showing a portion of a conventional electronic device package.

The general principles and embodiments of the present invention will be illustrated in detail with references made to the accompanying drawings. In the drawings or the description, similar or same reference numbers are used to designate similar or same elements. In addition, sizes or shapes of elements shown in the drawings may be expanded for clarity or simplicity. It should be understood that any element not shown or described may be any kind of conventional element as known by those skilled in the art.

In the following description, an image sensor package is used when illustrating an electronic device package and fabricating method thereof according to an embodiment of the present invention. However, it should be understood that embodiments of the present invention are not limited thereto. Other electronic devices may also be packaged according to embodiments of the present invention, which include electronic components including active or passive elements, digital or analog circuits, such as optoelectronic devices, micro electro mechanical systems (MEMS), micro fluidic systems, and physical sensors for detecting physical characteristics such as detecting heat, light, or pressure. In particular, a wafer scale package (WSP) process may be performed to package semiconductor chips which include image sensor devices, light-emitting diodes (LEDs), solar cells, Rf circuits, accelerators, gyroscopes, micro actuators, surface acoustic wave devices, pressure sensors, and ink printer heads.

For the wafer scale package process of the present invention, the electronic devices are first packaged at a wafer level and then diced into individual packages. However, in a specific embodiment, separate semiconductor chips may be, for example, redistributed on a carrier wafer for a subsequent packaging process, which may be called a wafer level package process. In addition, a stacking process may also be used in the wafer level package process mentioned above to stack a plurality of wafers having integrated circuits to form electronic device packages of multi-layered integrated circuit devices.

Figure 2A:
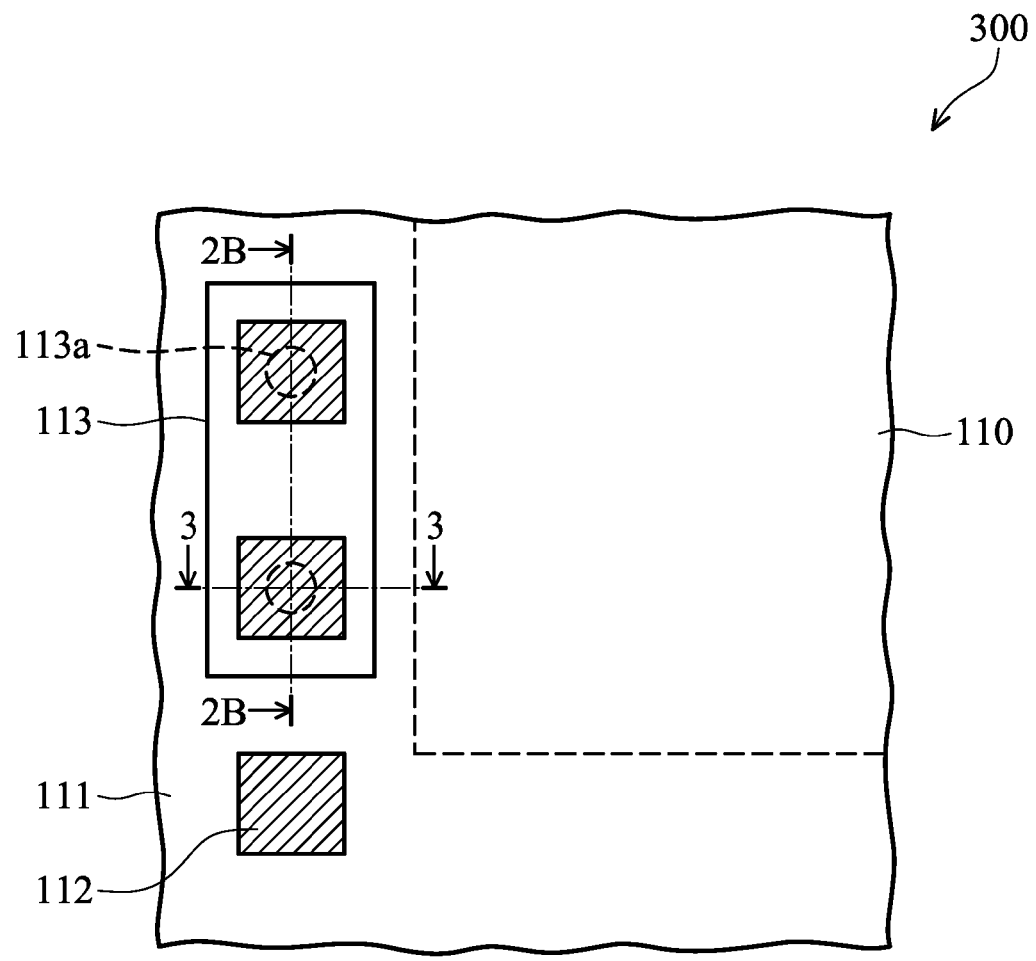
FIGS. 2A-2C are diagrams showing the fabricating process of an electronic device package in accordance with an embodiment of the present invention.
Figure 2B:
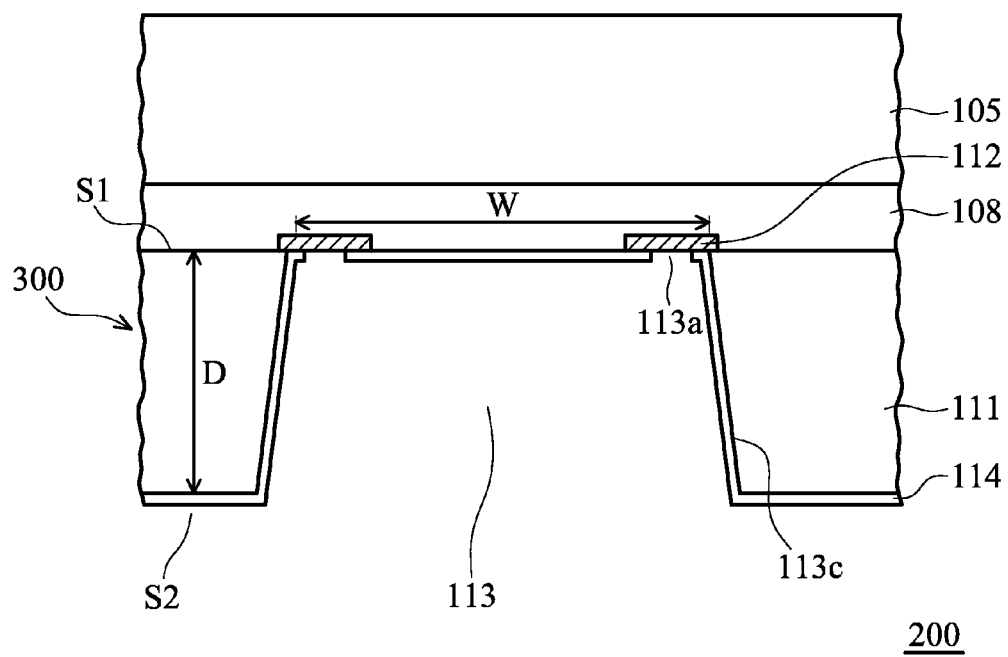
Figure 2C:
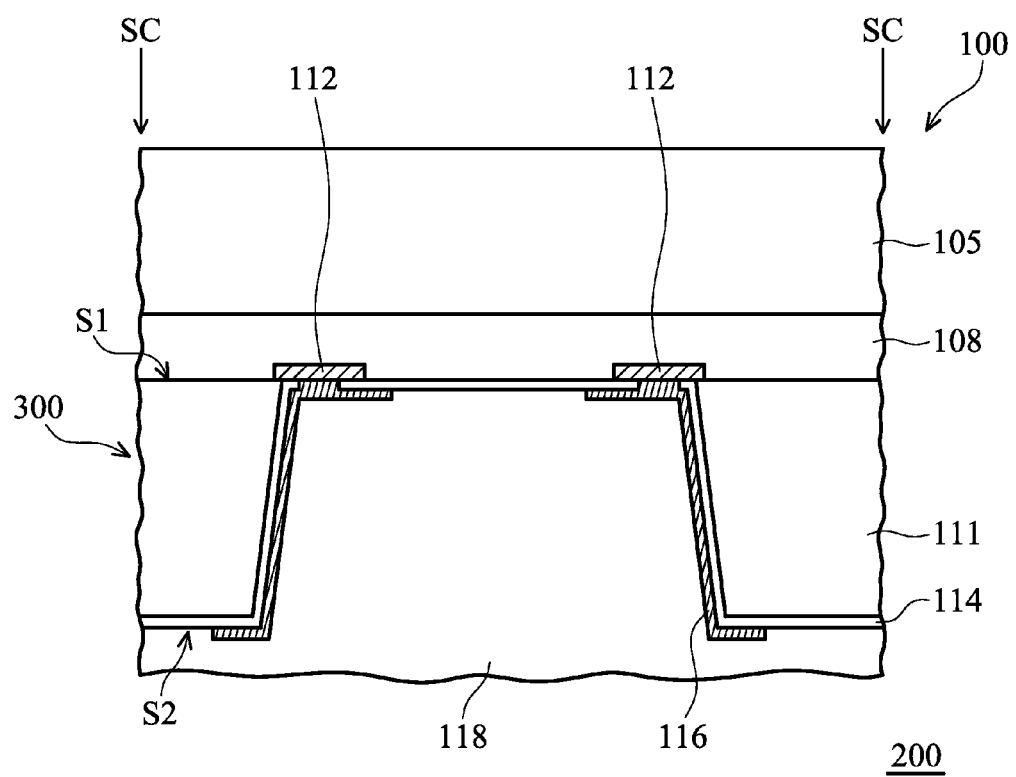

Referring to FIGS. 2A-2C, an embodiment of a wafer level package is illustrated. First, a wafer 200 is provided. The wafer 200 includes a plurality of die regions to carry or form a plurality of chips thereon. Each chip 300 has a first surface S1 and an opposite second surface S2. A plurality of conducting electrodes 112 are disposed directly on or overlying the first surface S1 of each of the chips 300. A package layer 105 is formed to cover the wafer 200 containing the first surfaces S1 of the chips. In an optional process step, the package layer 105 may be used as a supporting layer to perform a wafer thinning process or other subsequent processes.

A plurality of trenches 113 are formed in each of the chips 300. The trenches 113 extend along a direction from the second surface S2 to the first surface S1, such that a bottom portion of each of the trenches 113 exposes at least two conducting electrodes 112.

Referring to FIG. 2B, an insulating layer 114 is conformally formed, covering the second surfaces S2 of the chips 300 and extending to sidewalls and the bottom portions of the trenches. The insulating layer 114 is patterned to form at least two contact holes 113a at the bottom portion of each of the trenches. The contact holes 113a expose surfaces of the conducting electrodes 112.

Referring to FIG. 2C, a plurality of trace layers 116 are formed overlying the insulating layer 114. Each of the trace layers 116 extends from the second surface S2 to the sidewall of the trench and further extends overlying the contact surface of a corresponding conducting electrode 112 through a corresponding contact hole 113a.

A filling layer 118 is formed to fill the trenches 113 of the chips 300. The filling layer 118 extends overlying the second surface S2. The wafer 200 is diced along predetermined scribe lines SC to separate a plurality of package chips, to complete fabrication of the electronic device package 100. Fabrication of the electronic device package is illustrated in more detail in the following description.

Figure 3:
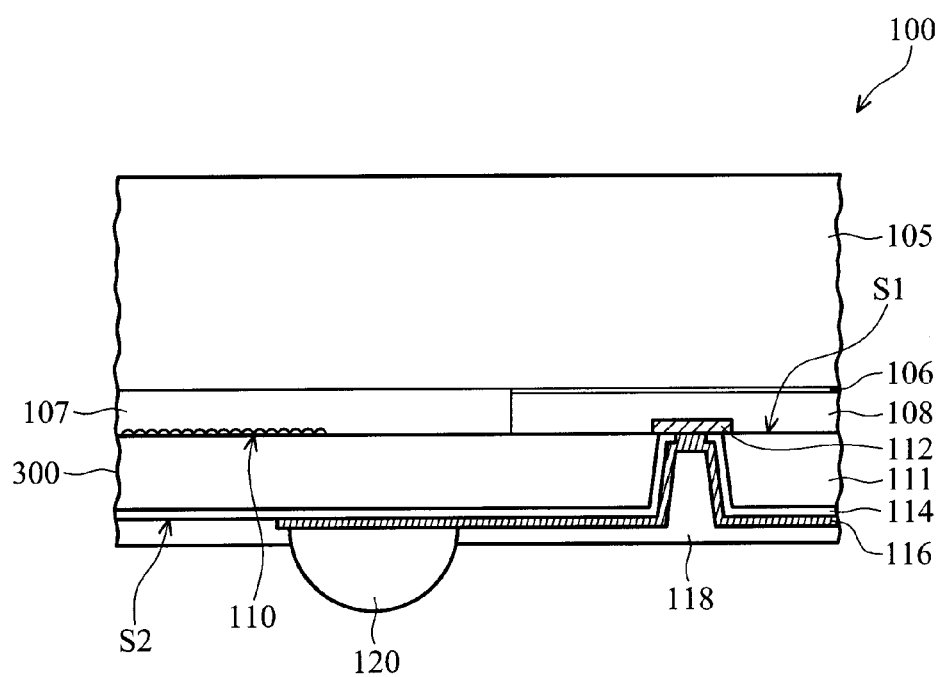
FIG. 3 is a cross-sectional view of an electronic device package taken along the line 3-3 of FIG. 2A.

FIG. 3 shows a cross-sectional view of a portion of an electronic device package according to an embodiment of the present invention. As shown in FIGS. 2A and 3, an electronic device package 100 includes a body of a chip 300, such as an image sensor chip, having a first surface and an opposite second surface. In one embodiment, the first surface S1 may include an active region 110 having an array of light detecting elements (not shown) disposed directly on or overlying. A plurality of conducting electrodes 112, such as conductive pads or redistribution layers, may be disposed on the peripheral region 111. Generally, the second surface S2 may be a back surface of the body of the chip 300. In this embodiment, taking at least two conducting electrodes 112 as a group, a trench 113 is formed thereon. For example, the trench 113 may extend into the body of the chip 300 along a direction from the second surface S2 to the first surface S1 by using a typical etching process. The bottom portion of the trench 113 includes at least two contact holes 113a. In one embodiment, the contact hole 113a exposes the contact surface of a corresponding conducting electrode 112.

FIGS. 2B-2C are cross-sectional views showing the steps of forming the electronic device package taken along the line 2B-2B of FIG. 2A. Referring to FIG. 2B, the body of the chip 300 of the electronic device package is etched to form a trench 113 in the peripheral region 111. The trench 113 exposes at least two corresponding conducting electrodes 112. Note that because the bottom portion of the trench of the present invention includes at least two conducting electrodes and the entire region between the conducting electrodes, the trench 113 has an aspect ratio (D/W) of about 0.33, which is lower than the 1.6 aspect ratio (D/W) of a conventional via hole. Thus, simplifying subsequent processes when compared to conventional methods. Then, in one embodiment, an insulating layer 114 is conformally formed. The insulating layer 114 extends from the second surface S2 to the bottom portion of the trench 113 along the sidewall 113c of the trench 113. Through a patterning process, at least two contact holes 113a are formed at the bottom portion of the trench to expose corresponding conducting electrodes 112.

Referring to FIG. 2C, a plurality of trace layers 116 (or conducting layers) are then formed in each of the trenches 113. One end of the trace layer 116 extends overlying the contact surface of the conducting electrode 112 at the bottom portion of the trench 113 through the corresponding contact hole 113a, while the other end of the trace layer 116 extends overlying the second surface S2 of the chip 300 along the sidewall of the trench 113 to electrically connect with a conductive bump or an array of pads (not shown) which may be formed in subsequent processes. It should be appreciated that each of the trace layers 116 may be disposed overlying the sidewall of the trench 113 near the corresponding conducting electrode 112 to reduce layout complexity. Specifically, due to increased area of the bottom portion of the trench, the trace layer 116 may fill the contact hole 113a more easily. Then, a filling layer 118 is formed to fill the trench 113 and extend overlying the second surface S2 to improve structural strength of the chip.

FIG. 3 shows a cross-sectional view of the electronic device package taken along the line 3-3 of FIG. 2A. In FIG. 3, an upper package layer 105 or a cover plate may further be formed to cover the active region 110. In one embodiment, a cavity 107 is formed between the upper package layer 105 and the active region 110. The cavity 107 is surrounded by a spacer layer 108 (or dam). To increase bonding strength, an additional adhesive layer 106 may be formed between the spacer layer 108 and the upper package layer 105. Generally, the spacer layer 108 is located on the conducting electrode 112. Then, a dicing process is performed to the wafer 200 to separate a plurality of chip packages.

In this chip package, the trench 113 extends into the body of the chip 300 along the direction from the second surface S2 to the first surface S1, wherein the bottom portion of the trench includes at least two contact holes 113a. The insulating layer 114 extends from the second surface to the sidewall of the trench and further surrounds the contact holes 113a at the bottom portion of the trench. It should be appreciated that the trench includes at least two contact holes, and each of the contact holes 113a exposes the contact surface of a conducting electrode 112. The conducting electrode 112 may be a conductive pad or a redistribution layer (RDL). The plurality of trace layers 116 are located overlying the insulating layer 114. Each of the trace layers 116 extends from the second surface S2 to the sidewall of the trench and extends overlying the contact surface of a corresponding conducting electrode 112 through the corresponding contact hole 113a at the bottom portion of the trench. The other end of the trace layer 116 extends along the sidewall of the trench to the conductive bump or the array of pads 120 over the second surface S2 (or back surface) of the chip 300. Further, the filling layer 118, such as a polyimide (PI) layer used as a solder mask, fills the trench of the semiconductor chip and extends overlying the second surface S2.

For the fabrication method for forming the electronic device package according to embodiments of the present invention, technical problems associated with aspect ratio can be overcome and the process margin may be improved for fabricating trench group via (TGV) package electronic devices.

Figure 4A:
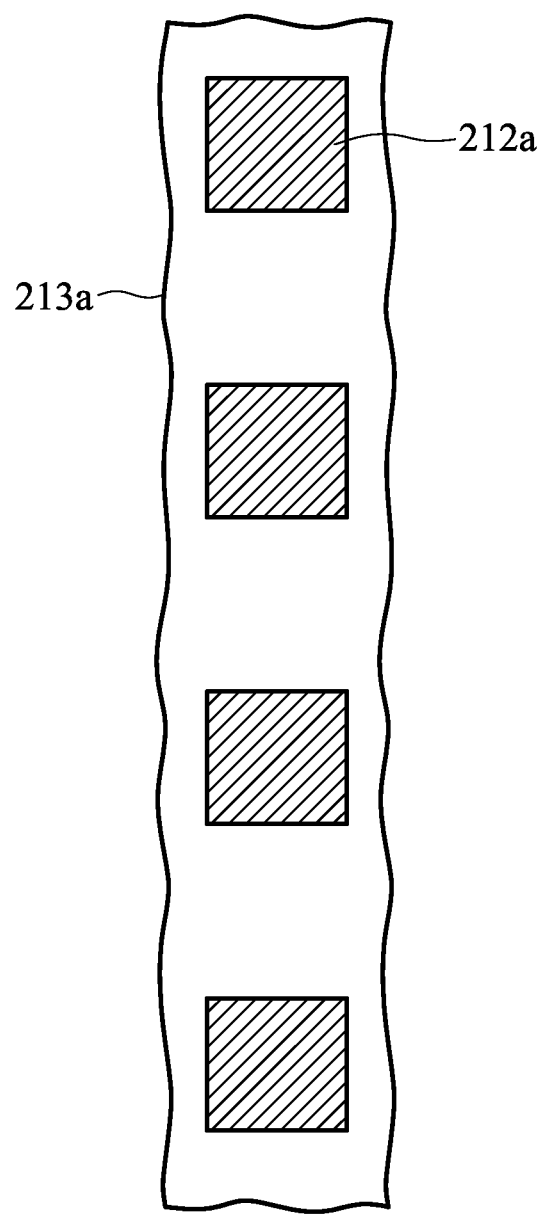
FIGS. 4A-4D are illustrative diagrams showing a group of conductive pads within a trench of an electronic device package in accordance with an embodiment of the present invention.
Figure 4B:
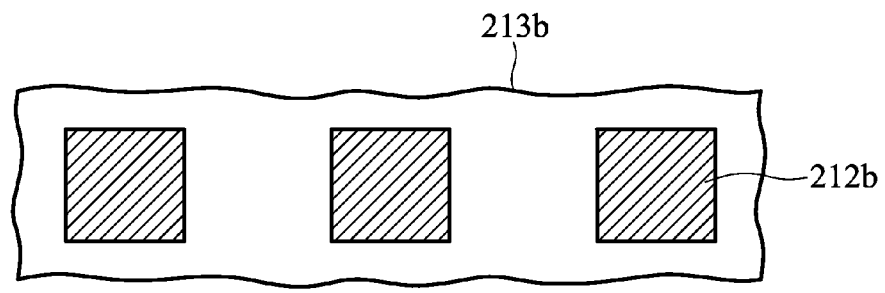
Figure 4C:
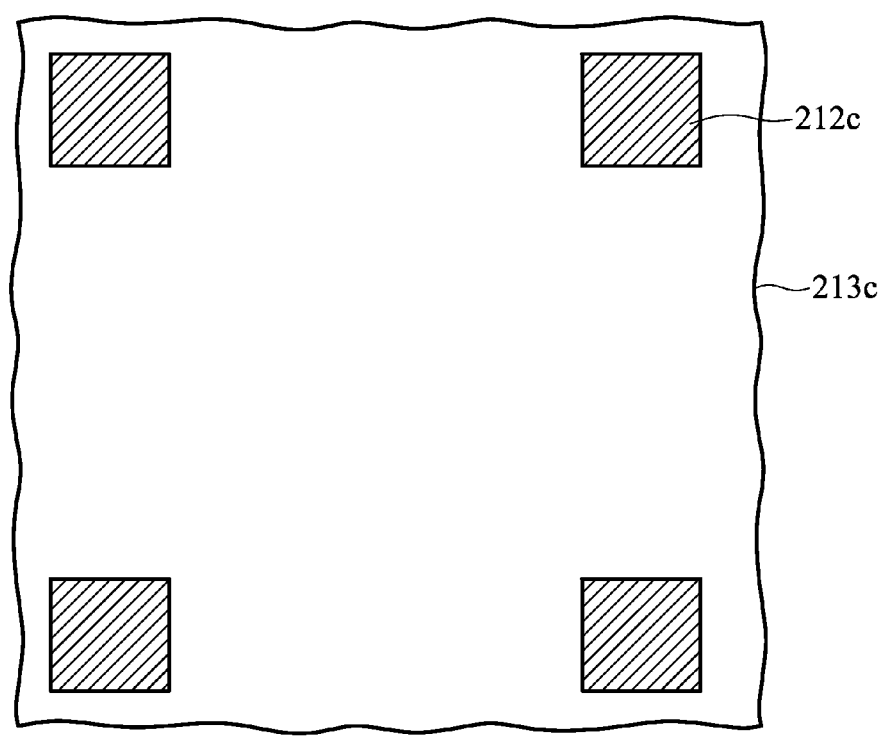

FIGS. 4A-4D are illustrative diagrams showing a group of conducting electrodes within a trench of an electronic device package in accordance with an embodiment of the present invention. FIG. 4A shows a trench 213a in a chip, wherein the bottom portion of the trench 213a includes a column series of conducting electrodes 212a. The conducting electrodes 212a are arranged along a vertical axis direction of the trench 213a. Further, FIG. 4B shows a trench 213b in a chip, wherein the bottom portion of the trench 213b includes a row series of conducting electrodes 212b. The conducting electrodes 212b are arranged along a horizontal axis direction of the trench 213b. Furthermore, a trench 213c includes an array of conducting electrodes 212c including at least four conducting electrodes 212c, as shown in FIG. 4C.

Figure 4D:
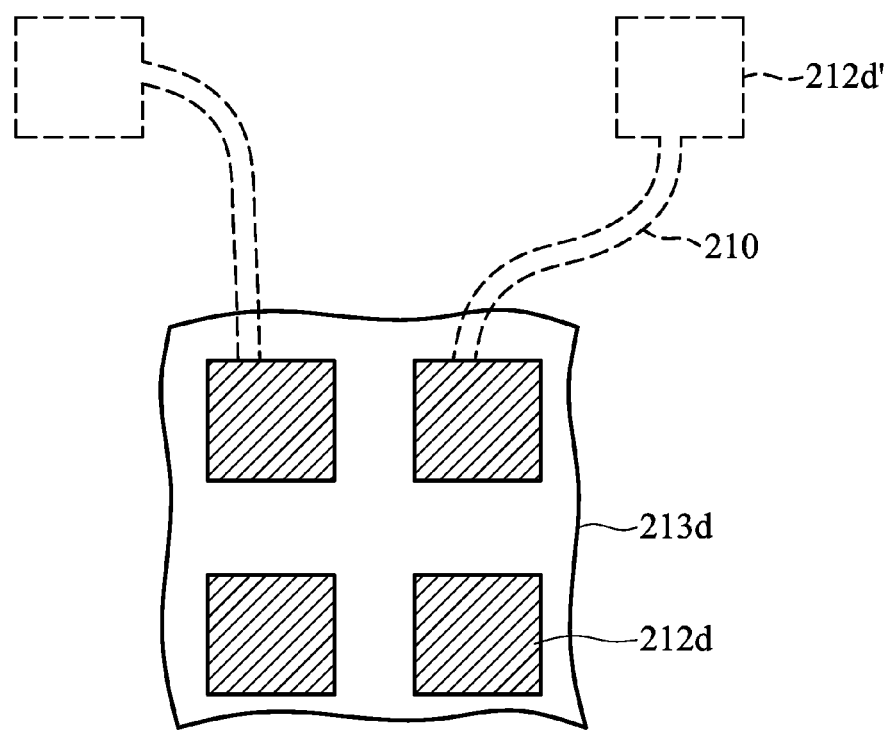

Referring to FIG. 4D, it should be appreciated that a conducting electrode 212d' located at a different disposition may be redistributed to a conducting electrode 212d in a specific trench through a redistribution layer (RDL) 210 or an extension pad, according to an embodiment of the present invention. Thus, conducting electrodes originally from different regions may be extended into the same trench 213d by a redistribution layer. In each of the trenches, the groups of the conducting electrodes may be regrouped according to the characteristics of the original conducting electrodes into a plurality of groups having the same electrical characteristics or a specific specification. For example, the group may include an input/output electrode group, a power electrode group, or a ground electrode group.

In addition, in the single chip package mentioned above, because the trench almost penetrates the entire body of the chip, there is no space remaining between the bottom portion of the trench and the first surface of the chip. However, additional integrated circuits, detecting films, or cavity structures may be needed in some situations. Therefore, in the following embodiment, the trench does not penetrate the entire body of the chip and still preserve low aspect ratio. For example, as described in the following embodiment, there are some regions dedicated between the bottom portion of the trench and the first surface of the chip to contain additional elements.

Figure 5A:
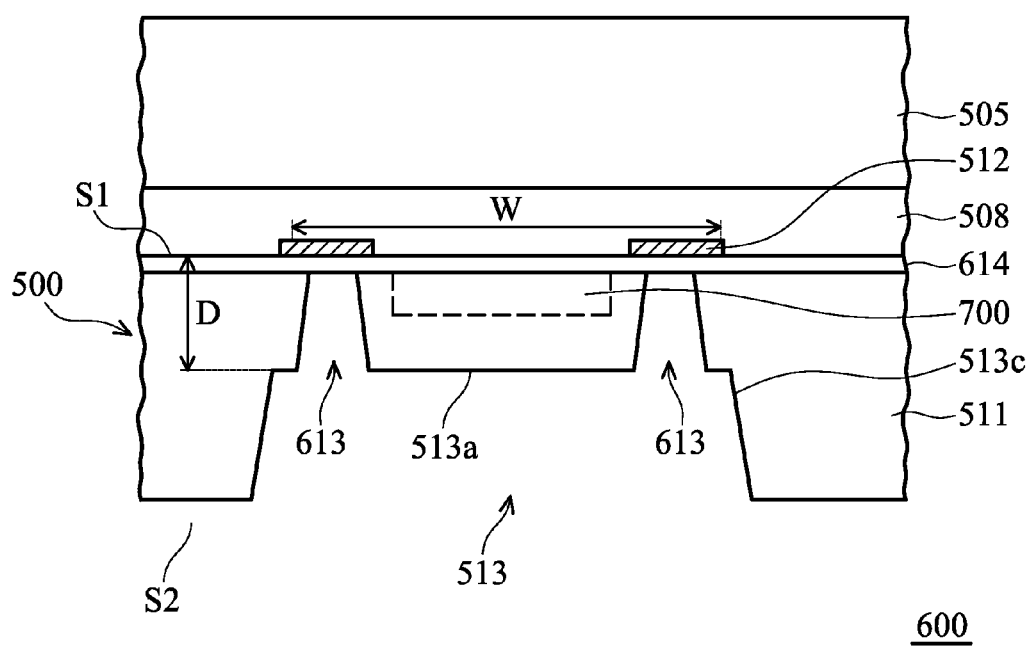
FIGS. 5A-5F are diagrams showing the fabricating process of an electronic device package in accordance with another embodiment of the present invention.
Figure 5B:
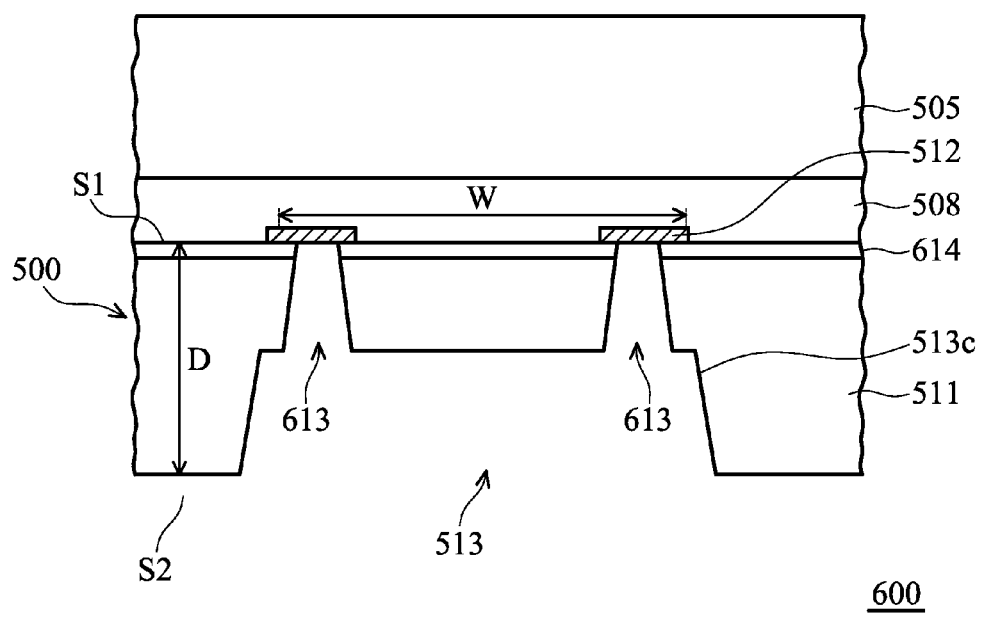
Figure 5C:
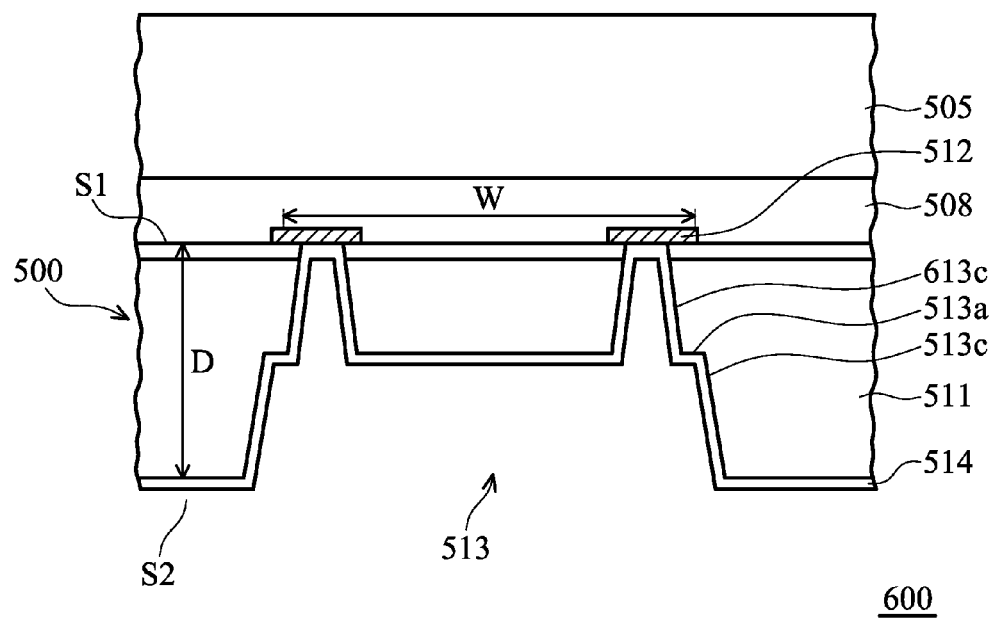
Figure 5D:
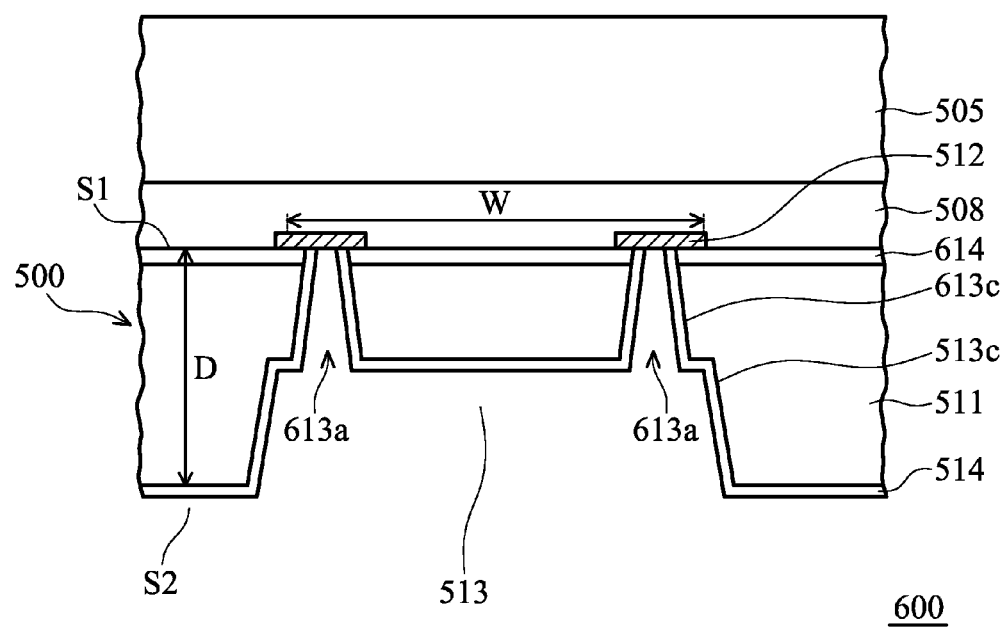
Figure 5E:
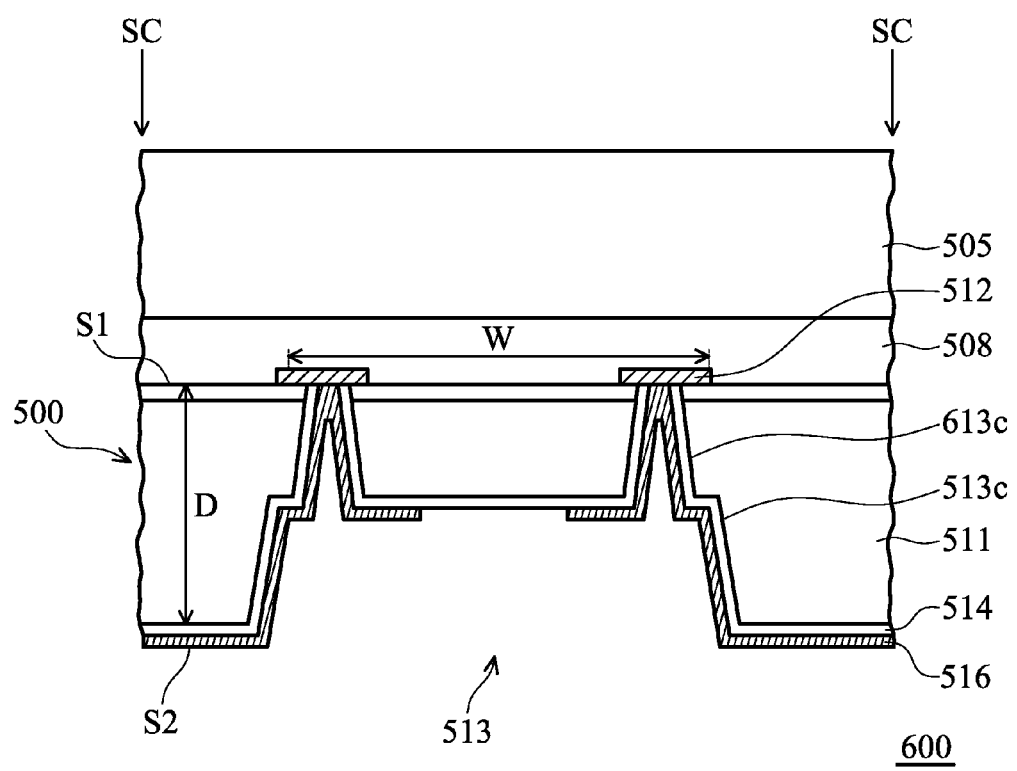
Figure 5F:
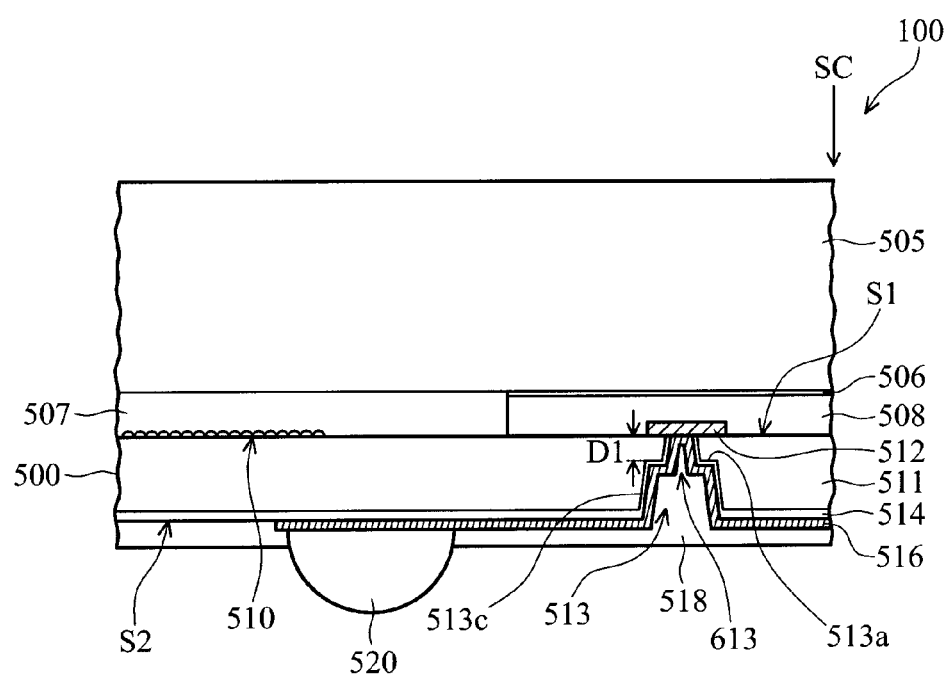

First, referring to FIG. 5F, a cross-sectional view of an electronic device package according to an embodiment of the present invention is illustrated. The electronic device package 100 includes a body of a chip 500 having a first surface S1 and an opposite second surface S2. A plurality of conducting electrodes 512, such as conductive pads or redistribution layers, are disposed directly on or overlying the first surface S1 of the chip. A trench 513 extends into the body of the chip 500 along a direction from the second surface S2 to the first surface S1. The bottom portion 513a of the trench is separated from the first surface S1 of the chip 500 by a predetermined distance D1. In this embodiment, at least two contact holes 613 may extend from the bottom portion 513a of the single trench to the corresponding conducting electrodes 512 to expose contact surfaces of the conducting electrodes 512.

In addition, in order to insulate the body of the chip 500 from a subsequently formed trace layer, the electronic device package further includes an insulating layer 514. The insulating layer 514 may conformally cover the second surface S2 of the chip 500 and extend overlying the sidewall 513c and the bottom portion 513a of the trench. The insulating layer 514 further extends from the bottom portion 513a of the trench to sidewalls of the contact holes 613.

Note that the region between the bottom portion 513a of the trench 513 and the first surface S1 of the chip may be used to contain semiconductor elements, such as integrated circuits, detecting films, or cavity structures. In this embodiment, because the contact hole 613 is adjacent to the region, the contact hole 613 should be at least higher than the region used to dispose the semiconductor elements, such as integrated circuits, detecting films, or cavity structures.

As shown in FIG. 5F, a plurality of trace layer 516 are located overlying the insulating layer 514. Each of the trace layers 516 may extend from the second surface S2 to the sidewall 513c and the bottom portion 513a of the trench and further extend overlying the contact surfaces of the corresponding conducting electrodes 512 through the corresponding contact holes 613. Note that a filling layer 518 may be filled into the trench 513 of the chip 500 and extend to overlie the second surface S2. It should be appreciated that the trench 513 includes at least two contact holes 613 in one embodiment, and each of the contact holes 613 only exposes the contact surface of one conducting electrode 512. The conducting electrode 512 may be a conductive pad or a redistribution layer (RDL).

The electronic device package mentioned above further includes a package layer, such as an upper package layer 505 or a cover plate covering an active region 510. In one embodiment, there is a cavity 507 between the upper package layer 505 and the active region 510. The cavity 507 is surrounded by a spacer layer 508 (or dam). Note that to increase bonding strength, an additional adhesive layer 506 may be formed between the spacer layer 508 and the upper package layer 505. Generally, the spacer layer 508 is located overlying the conducting electrode 512. In addition, the other end of the trace layer 516 extends along the sidewall of the trench 513 to a conductive bump or an array of pads 520 over the second surface S2 (back surface) of the chip 500. The filling layer 518, such as a polyimide (PI) layer, is used as a solder mask herein.

In this embodiment, the thickness D1 of the region between the bottom portion 513a of the trench and the first surface S1 of the chip substantially equals to about 5% to 80% of the thickness of the chip. Note that the design rules based on the semiconductor elements to be deposited, may be adjusted for the required aspect ratios of the trenches and contact holes, and structural strength of the chip body. For example, when the thickness of the chip is selected to be about 130 µm to 200 µm, the thickness of the region between the bottom portion 513a of the trench and the first surface S1 of the chip is preferably about 5 µm to 80 µm. In another case, when the thickness of the chip is about 130 µm to 160 µm, the thickness of the region between the bottom portion 513a of the trench and the first surface S1 of the chip is preferably about 10 µm to 75 µm in consideration the factors mentioned above.

Portions of the fabricating process of the electronic device package mentioned above may be performed by, for example, the steps shown in FIGS. 5A-5E. Referring to FIG. 5A, a wafer 600 is first provided, which includes a plurality of die regions for supporting or forming a plurality of chips 500 thereon. Each of the chips 500 includes a first surface S1 and an opposite second surface S2. A plurality of conducting electrodes 512 are disposed directly on or overlying the first surface S1 of the chip 500. An insulating layer 614 is formed between the chips 500 and the conducting electrodes 512. The insulating layer 614 may include, for example, a silicon oxide, silicon oxynitride, or low dielectric constant material.

Generally, a plurality of electronic device chips, such as image sensor elements are formed on the wafer 600. A corresponding micro-lens array may be disposed overlying the image sensor elements to serve as an image sensing surface.

Then, the front surface of the semiconductor wafer 600, i.e. the first surface S1 of the chip 500 having electronic devices, is bound with the package layer 505. The package layer 505 is used as a carrier structure of the package, which may include a glass, quartz, opal, plastic, or any other transparent substrates. It should be noted that a filter and/or an anti-reflective layer may be formed overlying the package layer 505. A spacer layer 508 may be disposed between the package layer 505 and the semiconductor wafer 600 to form a cavity 507 between the semiconductor wafer 600 and the package layer 505. The cavity 507 is surrounded by the spacer layer 508. The spacer layer 508 may be, for example, an adhesive material such as an epoxy resin.

Then, a wafer thinning process may be optionally performed. For example, the semiconductor wafer 600 may be thinned from the back surface S2 to form a wafer having the above-mentioned predetermined thickness. The thinning process may include an etching, milling, grinding, or polishing process.

Then, a plurality of trenches 513 are formed in the body of the chip 500. For example, a portion of the silicon substrate material is removed by an etching process. The trench extends along a direction from the second surface S2 to the first surface S1. The bottom portion 513a of the trench is separated from the first surface S1 of the chip by a predetermined distance D. Thus, a region 700 is provided to contain desired semiconductor elements therein. Meanwhile, the aspect ratios of the trench and the contact hole may be reduced to an appropriate degree while the structural strength of the chip still remains sufficient. In addition, the bottom portion 513a of the trench is etched to form a plurality of contact holes 613 exposing the surface of the insulating layer 614. In one embodiment, there are at least two contact holes in a single trench.

Then, referring to FIG. 5B, the insulating layer 614 in the contact holes 613 may be removed to expose the contact surfaces of the conducting electrodes 512 by an etching process, for example, a dry etching process.

Referring to FIG. 5C, in order to isolate the body of the chip 500 from the subsequently formed trace layers 516, an insulating layer 514 may first be conformally formed to cover the second surface S2 of the chip 500 and extend overlying the sidewalls 513c and the bottom portions 513a of the trenches. The insulating layer 514 further extends from the bottom portions 513a of the trenches to the sidewalls 613c of the contact holes.

In one embodiment, if the thermal budget is permitted, the insulating layer 514 may be formed by a thermal oxidation process to the silicon surface of the body of the chip 500 to directly form an oxide thin film. Note that because the conducting electrodes are made of common metal materials, the surfaces of the conducting electrodes are not oxidized. Thus, it is not necessary to perform an additional removing process.

In another embodiment, forming of the conformally formed insulating layer 514 may include the following steps. First, a photosensitive insulating material layer is formed to cover the second surface S2 of the chip. The photosensitive insulating material layer extends overlying the sidewalls 513c and the bottom portions 513a of the trenches 513 and further extends from the bottom portions 513a of the trenches to the sidewalls 613c and the bottom portions of the contact holes 613.

Referring to FIG. 5D, an exposure process is performed to portions of the photosensitive insulating material layer, before being developed in a developer solution. The photosensitive insulating material layer on the bottom portions of the contact holes 613 is removed to expose the contact surfaces 613a of the conducting electrodes 512. In this embodiment, a photosensitive organic polymer material may be adopted, which may include, but is not limited to, a polyimide (PI), butylcyclobutene (BCB), parylene, polynaphthalene, fluorocarbon, or accrylate material. The photosensitive organic polymer material layer may be formed by a coating method, such as a spin coating, spray coating, curtain coating, or any other suitable coating method.

Referring to FIG. 5E, a plurality of trace layers 516 are formed overlying the insulating layer 514. Each of the trace layers 516 extends from the second surface S2 to the sidewall 513c of the trench and extends from the bottom portion 513a of the trench to the contact surface 613a of the corresponding conducting electrode 512 through the corresponding contact hole 613. For example, a physical vapor deposition (PVD) method or sputtering method may be performed to conformally deposit a conducting layer, made of materials such as copper, aluminum, silver (Ag), nickel (Ni), or alloys thereof, overlying the trenches 513, the contact holes 613, and the back surface S2 of the semiconductor wafer 600. Then, the conducting layer is patterned by a photolithography and etching process to form the trace layers 516. In this embodiment, the trace layers are in the same trench and connect to different conducting electrodes in different contact holes, which are electrically isolated from each other. The conducting electrode generally includes a conductive pad or a redistribution layer.

Referring to FIG. 5F, a passivation layer 518 is then formed overlying the trace layers 516 to cover the back surface S2 of the semiconductor wafer 600 and the trenches 513 or the contact holes 613. The passivation layer may be, for example, a solder mask. Then, conductive bumps 520 are formed to penetrate the passivation layer 518 and electrically connect to the trace layers 516. In one embodiment, after forming the passivation layer 518, the passivation layer 518 may be patterned to form a plurality of openings exposing portions of the trace layers 516. Note that by using an electroplating or a screen printing method, a solder is then filled into the openings mentioned above. Then, a re-flow process is performed to form the conductive bumps 520, such as solder balls or solder pad. Then, the wafer is diced along the scribe lines SC to separate the electronic device packages from each other, thus accomplishing forming of the electronic device package according to an embodiment of the present invention.

In addition, the position of the trench mentioned above may occupy the sides and the scribe line region between two adjacent chips, as described in the following embodiment. However, for simplicity, similar or same elements or fabricating processes will not be described again.

Figure 6A:
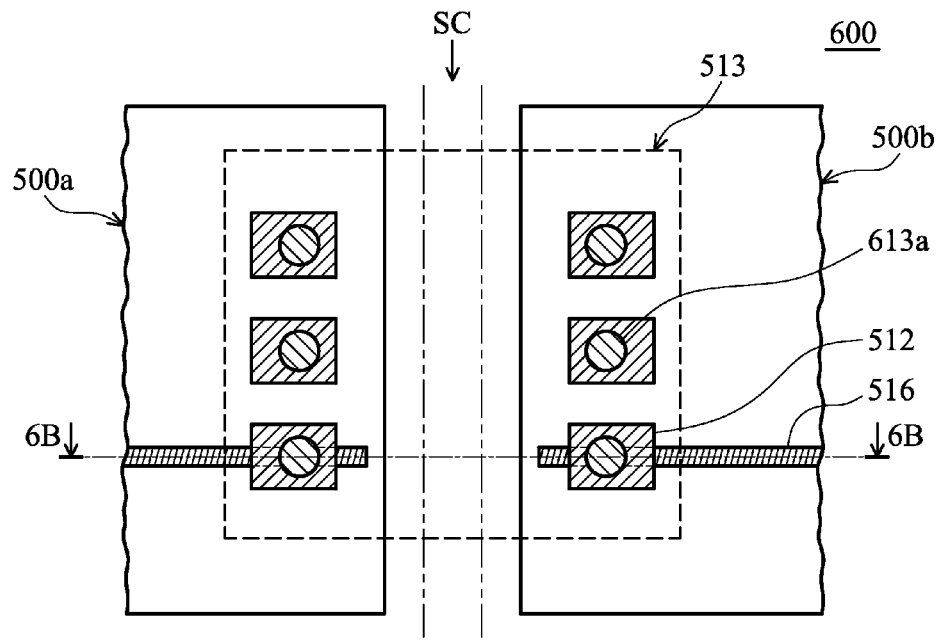
FIGS. 6A-6B are diagrams showing the fabricating process of an electronic device package in accordance with yet another embodiment of the present invention.
Figure 6B:
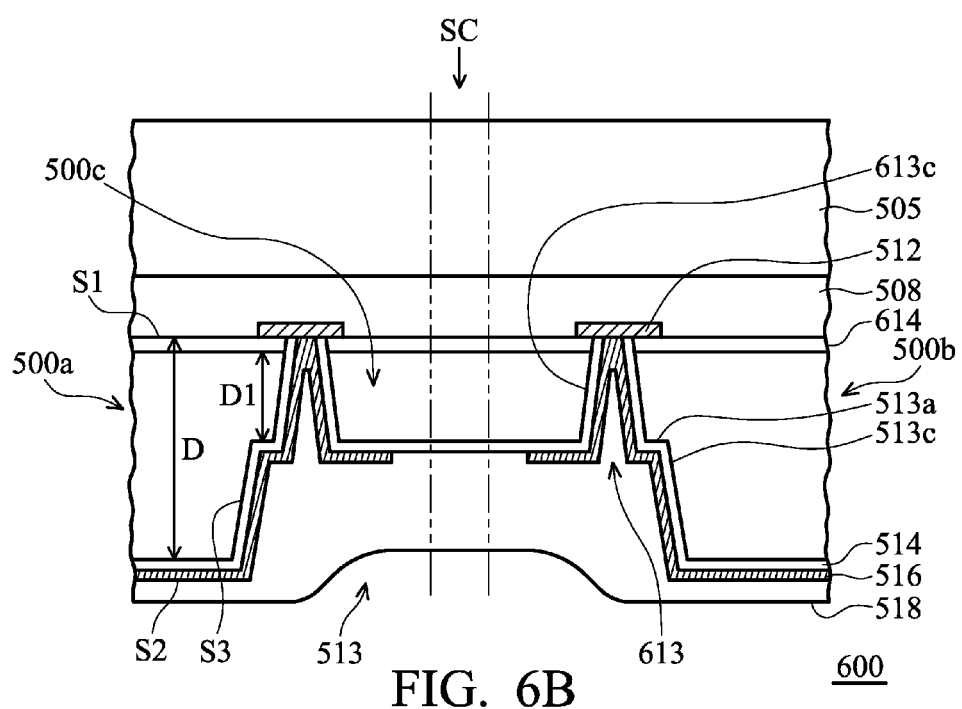

A portion of the fabricating process of the electronic device package of this embodiment is illustrated in FIGS. 6A-6B, wherein FIG. 6B is a cross-sectional view of the electronic device package shown in FIG. 6A taken along the line 6B-6B of FIG. 6A. Referring to FIGS. 6A and 6B, the wafer 600 includes a plurality of die regions to carry or form a plurality of chips thereon. There are scribe lines SC between any two adjacent chips 500a and 500b. Each of the chips has a first surface S1 and an opposite second surface S2. A plurality of conducting electrodes 512 are directly on or overlying the first surface S1 of each of the chips. There is an insulating layer 614 between each of the chips and the conducting electrodes 512. Note that the steps concerning forming of the package layer 505, forming of the spacer layer 508, and thinning of the wafer are similar to previously described steps, thus they will not be described again In this embodiment, the disposition of the trench 513 occupies the sides and the scribe line SC region between two adjacent chips 500a and 500b. The trench 513 extends along a direction from the second surface S2 to the first surface S1. The bottom portion 513a of the trench is separated from the first surfaces S1 of the two adjacent chips 500a and 500b by a predetermined distance D1.

Then, the bottom portion 513a of the trench is etched to form a plurality of contact holes 613 exposing the surface of the insulating layer 614 between the two adjacent chips 500a and 500b. Then, the insulating layer 614 in the contact holes 613 is etched to expose the conducting electrodes 512.

Next, an insulating layer 514 is conformally formed to cover the second surfaces S2 of the chips. The insulating layer 514 extends overlying the sidewall 513c and the bottom portion 513a of the trench and further extends from the bottom portion 513a of the trench to the sidewalls 613c of the contact holes. The insulating layer 514 may be formed by the methods mentioned above. A thermal oxidation process may be performed to the silicon substrate. In another embodiment, a photosensitive organic polymer material layer may first be applied, followed by a partially exposure process and development process.

Thereafter, a plurality of trace layers 516 are formed overlying the insulating layer 514. Each of the trace layers 516 extends from the second surface S2 to the sidewall 513c and the bottom portion 513a of the trench and extends overlying the contact surface of a corresponding conducting electrode 512 through the corresponding contact hole 613. The trace layer 516 may be formed by forming a conducting material layer first, followed by a patterning process to define the desired trace layers. Note that the defined trace layers may be isolated from each other at the position near the scribe line SC region, thus protecting the trace layers from the outside environment.

A filling layer 518 is then formed to fill the trench 513 of the chips 500a and 500b. The filling layer 518 extends overlying the second surface S2. After the conductive bumps are formed, the wafer 600 may be diced along the scribe lines SC to separate a plurality of chip packages.

According to the fabricating process mentioned above, because the trench after the dicing process becomes a cave region of the chip, as that shown in the chips 500a and 500b, a side region S3 located on the second surface S2 concaves downward to form the cave region (or named as a trench) in the formed electronic device package. Take the chip 500a as an example, the bottom portion 513a of the cave region is separated from the first surface S1 of the chip 500a by a predetermined distance D1. At least two contact holes 613 extend from the bottom portion 513a of the cave region to the corresponding conducting electrode 512 to expose the contact surfaces of the conducting electrodes. The insulating layer 514 conformally covers the second surface S2 of the chip 500a and extends overlying the sidewall and the bottom portion of the cave region. The insulating layer 514 further extends overlying the sidewalls 613c of the contact holes from the bottom portion 513a of the cave region.

A plurality of trace layers 516 are located overlying the insulating layer 514. Each of the trace layers 516 extends from the second surface S2 to the sidewall 513c and the bottom portion 513a of the cave region and extends overlying the contact surface of the conducting electrode 512 through the corresponding contact hole 613. In one embodiment, the filling layer 518 fills into the cave region of the chip 500a and extends overlying the second surface S2. A package layer 505 may be used to cover the first surface S1 which may include an active surface of the chip. The second surface S2 includes the back surface of the chip. The trace layers 516 and the portions outside the contact holes 613 are covered by the filling layer 518 in the cave region, together with the body 500c of the chip 500a, thus providing sufficient structural strength and protection.

In addition, as mentioned above, the region between the bottom portion of the cave region and the first surface of the chip has a thickness which substantially equals to about 5% to 80% of the thickness of the chip. For example, when the thickness of the chip is selected to be about 100 μm to 200 μm, the thickness of the region between the bottom portion 513a of the cave region and the first surface S1 of the chip is preferably about 5 μm to 80 μm. In another case, when the thickness of the chip is about 130 μm to 160 μm, the thickness of the region between the bottom portion 513a of the cave region and the first surface S1 of the chip is preferably about 10 μm to 75 μm.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package, comprising:
   a chip having a wafer body defined between a first surface and an opposite second surface; and
   a trench provided in the wafer body and extending along a direction from the second surface to the first surface, wherein a bottom portion of the trench includes at least two contact holes that are spaced apart laterally across the bottom portion of the trench and extending to the first surface of the wafer body.

2. The electronic device package as claimed in claim 1, further comprising an insulating layer conformally covering the second surface of the chip, extending to overlie a sidewall of the trench, and surround each of the contact holes at the bottom portion of the trench.

3. The electronic device package as claimed in claim 2, further comprising a plurality of conducting electrodes directly on or overlying the first surface of the chip, wherein each of the contact holes at the bottom of the trench exposes a contact surface of a corresponding conducting electrode.

4. The electronic device package as claimed in claim 3, wherein each of the conducting electrodes comprises a conductive pad or a redistribution layer.

5. The electronic device package as claimed in claim 3, further comprising a plurality of trace layers overlying the insulating layer, wherein each of the trace layers extends from the second surface to the sidewall of the trench and extends overlying the contact surface of a corresponding conducting electrode through the corresponding contact hole.

6. The electronic device package as claimed in claim 2, further comprising a filling layer substantially filling the trench of the chip and extending to overlie the second surface.

7. An electronic device package, comprising:
   a chip having a wafer body defined between a first surface and an opposite second surface;
   a trench provided in the wafer body along a direction from the second surface to the first surface, wherein a bottom portion of the trench includes at least two contact holes that are not coaxial and extending to the first surface of the wafer body;
   an insulating layer conformally covering the second surface of the chip, extending to overlie a sidewall of the trench, and surround each of the contact holes at the bottom portion of the trench;
   a plurality of conducting electrodes directly on or overlying the first surface of the chip, wherein each of the contact holes at the bottom portion of the trench exposes a contact surface of a different corresponding conducting electrode, and wherein each of the conducting electrodes comprises a conductive pad or a redistribution layer; and
   a plurality of trace layers overlying the insulating layer, wherein each of the trace layers extends from the second surface to the sidewall of the trench and extends overlying the contact surface of a corresponding conducting electrode through the corresponding contact hole.

8. The electronic device package as claimed in claim 7, wherein at least one of the conducting electrodes in the trench extends to another region through a redistribution layer.

9. The electronic device package as claimed in claim 8, wherein a group of the conducting electrodes in the trench comprises an input/output electrode group, a power electrode group, or a ground electrode group.

10. The electronic device package as claimed in claim 8, wherein a group of the conducting electrodes comprises the conducting electrodes having substantially the same electrical characteristics.

11. An electronic device package, comprising:
    a chip having a wafer body defined between a first surface and an opposite second surface;
    a plurality of conducting electrodes directly on or overlying the first surface of the chip;
    a trench provided in the wafer body and extending along a direction from the second surface to the first surface, wherein a bottom portion of the trench is separated from the first surface by a predetermined distance; and
    at least two contact holes extending from the bottom portion of the trench to the corresponding conducting electrodes to expose contact surfaces of the corresponding conducting electrodes.

12. The electronic device package as claimed in claim 11, further comprising an insulating layer conformally covering the second surface of the chip, extending to overlie a sidewall and the bottom portion of the trench, and extending from the bottom portion of the trench to sidewalls of the contact holes.

13. The electronic device package as claimed in claim 11, wherein a region between the bottom portion of the trench and the first surface of the chip is used to contain an integrated circuit, a detecting film, or a cavity structure.

14. The electronic device package as claimed in claim 13, wherein the contact hole is at least higher than the integrated circuit, the detecting film, or the cavity structure.

15. The electronic device package as claimed in claim 12, wherein each of the conducting electrodes comprises a conductive pad or a redistribution layer.

16. The electronic device package as claimed in claim 15, further comprising a plurality of trace layers overlying the insulating layer, wherein each of the trace layers extends from the second surface to the sidewall and the bottom portion of the trench and extends overlying the contact surface of a corresponding conducting electrode through the corresponding contact hole.

17. The electronic device package as claimed in claim 16, further comprising a filling layer substantially filling the trench of the chip and extending to overlie the second surface.

18. The electronic device package as claimed in claim 17, further comprising a package layer used for covering the first surface, wherein the first surface comprises an active surface of the chip, and wherein the second surface comprises a back surface of the chip.

19. An electronic device package, comprising:
- a chip having a wafer body defined between a first surface and an opposite second surface, wherein a peripheral region located on the second surface concaves downward to form a trench region in the wafer body, and wherein a bottom portion of the trench region is separated from the first surface of the wafer body by a predetermined distance;
- a plurality of conducting electrodes directly on or overlying the first surface of the wafer body; and
- at least two contact holes extending from the bottom portion of the trench region to the corresponding conducting electrodes to expose contact surfaces of the corresponding conducting electrodes.

20. The electronic device package as claimed in claim 19, further comprising:
- an insulating layer conformally covering the second surface of the wafer body extending to overlie a sidewall and the bottom portion of the trench region, and extending from the bottom portion of the trench region to sidewalls of the contact holes; and
- a plurality of trace layers overlying the insulating layer, wherein each of the trace layers extends from the second surface to the sidewall and the bottom portion of the trench region and extends overlying the contact surface of a corresponding conducting electrode through the corresponding contact hole.

21. The electronic device package as claimed in claim 11, wherein the at least two contact holes are spaced apart laterally across the bottom portion of the trench.

22. The electronic device package as claimed in claim 19, wherein the at least two contact holes are spaced apart laterally across the bottom portion of the trench.

23. The electronic device package as claimed in claim 1, wherein the first surface and the second surface of the wafer body are opposing planar surfaces of a silicon wafer body.

24. The electronic device package as claimed in claim 7, wherein the first surface and the second surface of the wafer body are opposing planar surfaces of a silicon wafer body.

* * * * *